United States Patent
Maki

(10) Patent No.: US 6,590,570 B1
(45) Date of Patent: Jul. 8, 2003

(54) COMPARATOR, DISPLAY APPARATUS USING COMPARATOR FOR DRIVING SYSTEM, AND DRIVING METHOD FOR COMPARATOR

(75) Inventor: Yasuhito Maki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/567,231

(22) Filed: May 9, 2000

(30) Foreign Application Priority Data

May 19, 1999 (JP) ............................................. 11-138304

(51) Int. Cl.[7] .............................................. G09G 5/00
(52) U.S. Cl. ........................... 345/204; 345/61; 345/62; 345/98; 345/99; 345/100; 345/211; 345/212; 257/392; 257/393; 327/63; 327/65; 365/185.22; 365/185.26; 365/185.23
(58) Field of Search ................................. 345/204, 211, 345/212, 61, 62, 98, 99, 100; 365/185.22, 185.26, 185.23; 327/63, 65; 257/392, 393

(56) References Cited

U.S. PATENT DOCUMENTS

| | | | | |
|---|---|---|---|---|
| 5,448,441 A | * | 9/1995 | Raposa | 361/18 |
| 6,125,075 A | * | 9/2000 | Watanabe et al. | 365/230.06 |
| 6,150,851 A | * | 11/2000 | Ohmi et al. | 327/91 |
| 6,225,992 B1 | * | 5/2001 | Hsu et al. | 345/211 |
| 6,229,508 B1 | * | 5/2001 | Kane | 345/82 |
| 6,236,393 B1 | * | 5/2001 | Ogawa et al. | 345/211 |
| 6,275,210 B1 | * | 8/2001 | Maekawa | 345/98 |
| 6,304,256 B1 | * | 10/2001 | Nagaya | 345/211 |
| 6,320,429 B1 | * | 11/2001 | Yano | 327/89 |

FOREIGN PATENT DOCUMENTS

| | | |
|---|---|---|
| EP | 0 739 092 A1 | 10/1996 |
| WO | 99/21278 | 4/1999 |

* cited by examiner

Primary Examiner—Richard Hjerpe
Assistant Examiner—Abbas Abdulselam
(74) Attorney, Agent, or Firm—Rader, Fishman & Grauer PLLC; Ronald P. Kananen

(57) ABSTRACT

A comparator which can operate stably against an absolute value distribution of a threshold voltage among MOS transistors and has a wide allowable range against the threshold voltage dispersion and besides allows reduction in power consumption. The comparator employs a single MOS transistor, and a resistance element is connected between the drain electrode of the MOS transistor and a power supply. A capacitor is connected between the gate electrode of the MOS transistor and a dc potential point, and a switch is connected between the gate electrode and the drain electrode. A comparison reference level and comparison input data are inputted in a time series to the source electrode of the MOS transistor, and the MOS transistor performs a comparation operation.

22 Claims, 12 Drawing Sheets

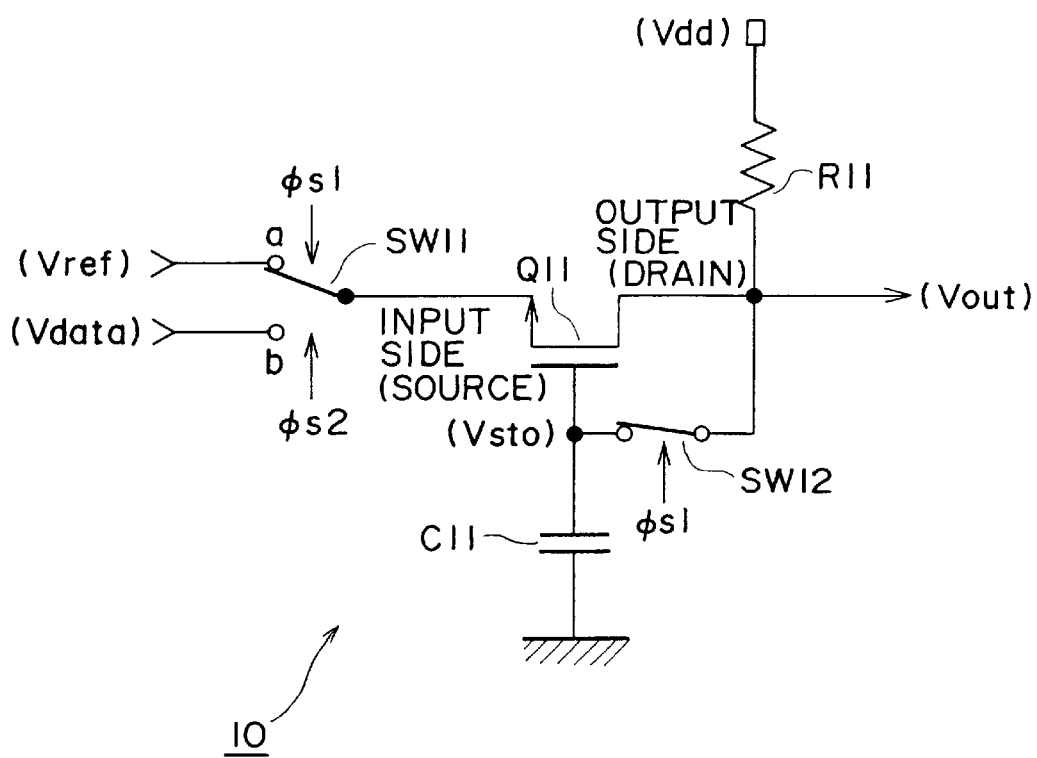
F I G.1

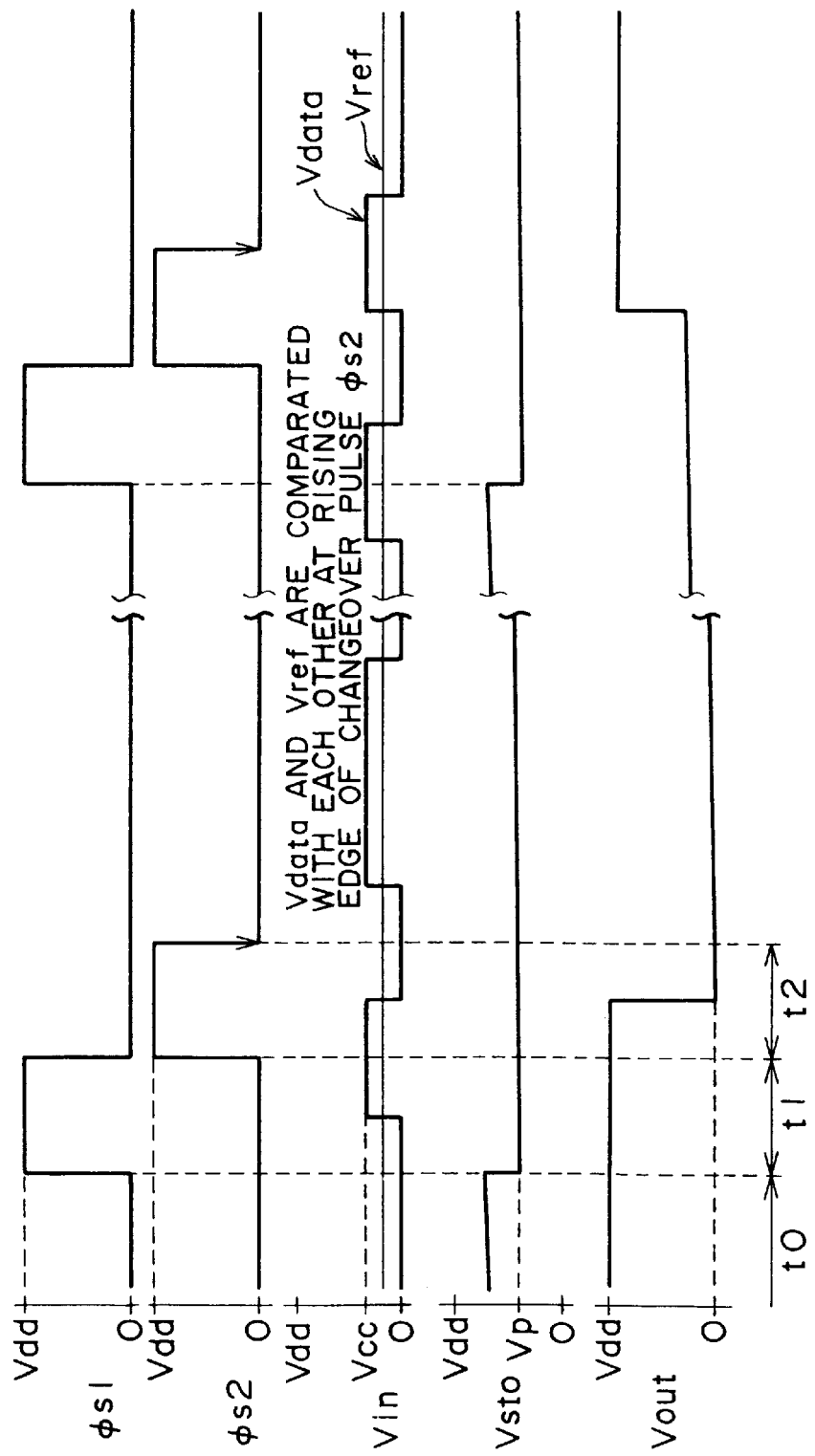

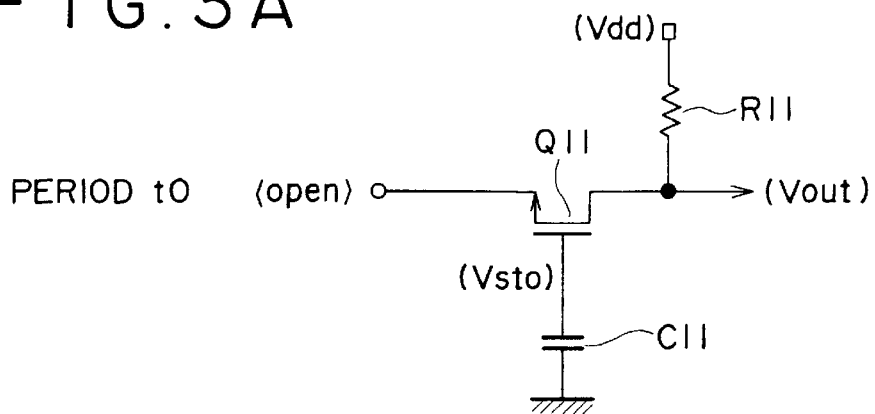
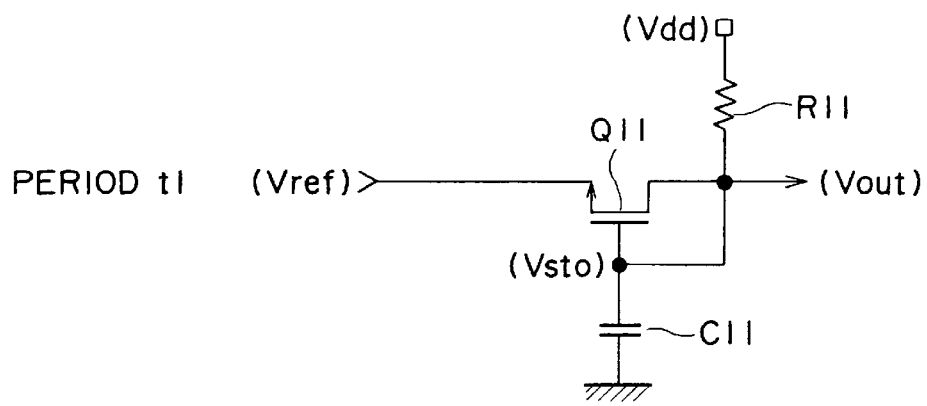
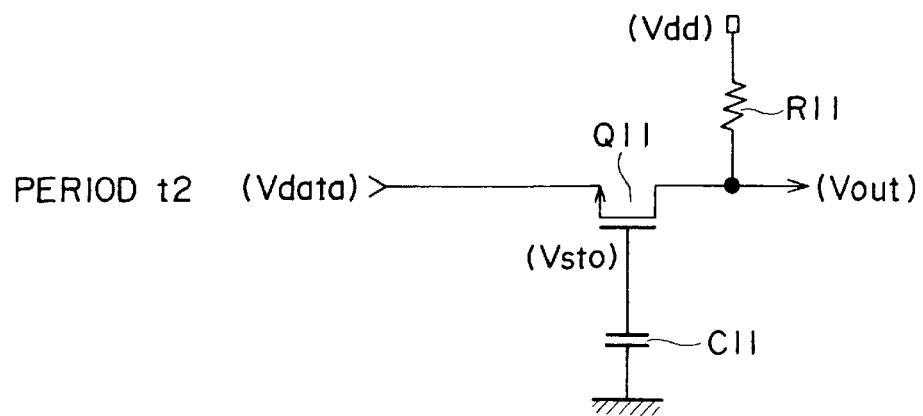

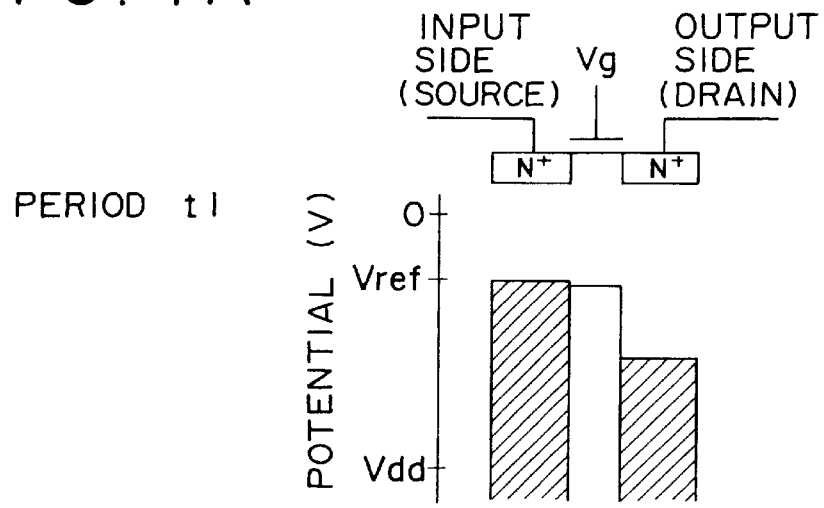
FIG. 4A PERIOD t1
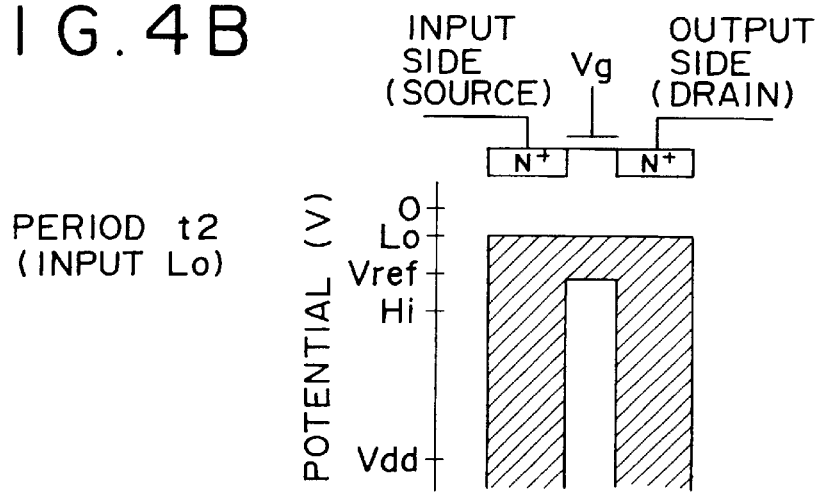
FIG. 4B PERIOD t2 (INPUT Lo)
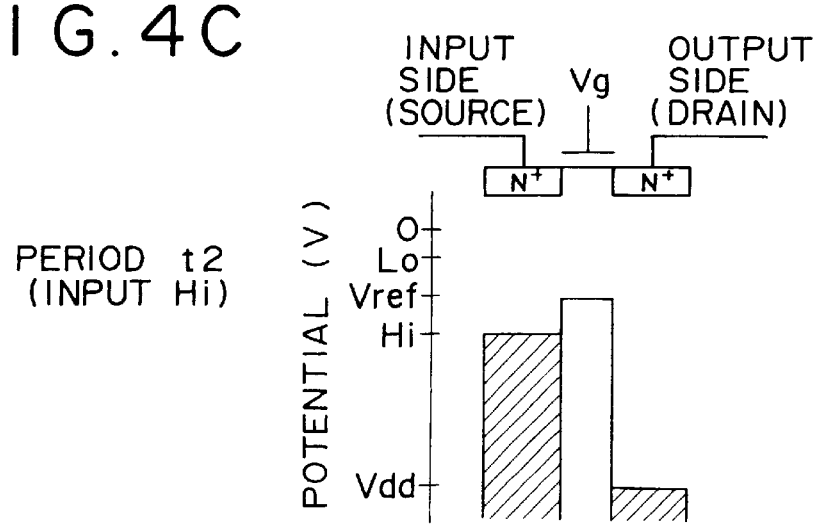
FIG. 4C PERIOD t2 (INPUT Hi)

F I G. 5
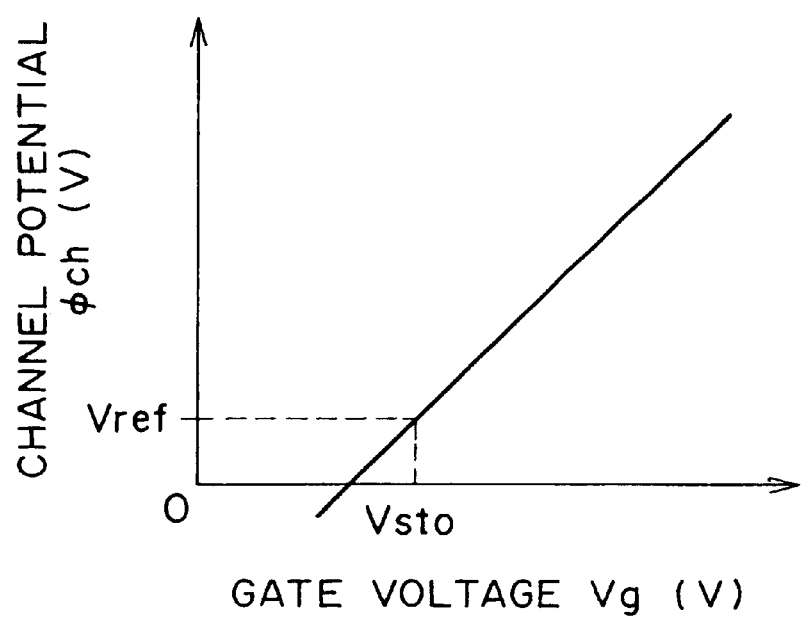

ically presupposes that characteristics of adjacent transistors such as the threshold voltage Vth, the drain-source current Ids and so forth are almost same. Actually, however, there is some difference between characteristics of adjacent transistors, and from this reason, the minimum comparison voltage is set to a comparatively high value.

COMPARATOR, DISPLAY APPARATUS USING COMPARATOR FOR DRIVING SYSTEM, AND DRIVING METHOD FOR COMPARATOR

BACKGROUND OF THE INVENTION

This invention relates to a comparator, a display apparatus which uses the comparator for a driving system and a driving method for the comparator, and more particularly to a comparator of the boosting type which outputs, as a comparison output signal, a signal of a higher level than that of a comparison input signal and a display apparatus as represented by a liquid crystal display apparatus or an EL (electroluminescence) display apparatus which uses the comparator as part of a circuit which forms a driving system as well as a driving method for the comparator.

As the process generation of the MOS LSI proceeds and the power supply voltage for a MOS LSI drops, also the output voltage of the LSI drops. As an example, if a peripheral circuit of a liquid crystal display apparatus is incorporated into an LSI, then the level of a driving pulse or display data supplied from the peripheral circuit in the form of an LSI to a driving system of the liquid crystal display apparatus becomes lower. However, in order to satisfy a demand for the picture quality of a liquid crystal display apparatus, it is necessary, under the present conditions, to apply a voltage of approximately 5 V to the liquid crystal.

Meanwhile, in a liquid crystal display apparatus which uses a TFT (thin film transistor) as a switching element for a pixel or the like, in order to apply 5 V to the liquid crystal, a driving voltage of approximately 10 V is required for a driver, a pixel transistor or the like formed from a TFT from characteristics of the TFT. In other words, it is necessary to mount a level shifter, a comparator or the like (conversion into an on-panel device) for converting display data of a small amplitude from the outside into display data of a TFT operation level on a liquid crystal panel (transparent insulating plate on which a pixel section is formed).

However, where a level shifter, a comparator or the like is formed as an on-panel device, there is a problem that characteristics of adjacent or neighboring transistors exhibit some dispersion, which is particularly remarkable with the TFT. Due to such dispersion, it is necessary to make the amplitude of an input signal greater than a certain level.

Meanwhile, reduction of power consumption is required particularly for a liquid crystal panel used for a portable apparatus. If an ordinary level shifter is mounted on a liquid crystal panel, then since it consumes much power, it is necessary also to take a countermeasure for reduction of power consumption. For the level shifter, for example, a comparator of the boosting type is used.

A comparator is a circuit which compares two or more input signals and outputs a comparison result of a high level (hereinafter referred to as "H" level) or a low level (hereinafter referred to as "L" level) in response to a relationship in magnitude among signal levels of the input signals. Usually, at least two transistors are used to compare input signal levels. The circuit system in this instance basically presupposes that characteristics of adjacent transistors such as the threshold voltage Vth, the drain-source current Ids and so forth are almost same. Actually, however, there is some difference between characteristics of adjacent transistors, and from this reason, the minimum comparison voltage is set to a comparatively high value.

FIG. 13 shows a comparator of the boosting type as a related art. Referring to FIG. 13, the comparator shown includes an N-channel MOS transistor Q101 and a P-channel MOS transistor Q102 connected in series between the ground and a power supply Vdd, and an N-channel MOS transistor Q103 and a P-channel MOS transistor Q104 connected in series between the ground and the power supply Vdd similarly. The gate electrode of the MOS transistor Q102 is connected to a drain common junction S between the MOS transistors Q103 and Q104, and the gate electrode of the MOS transistor Q104 is connected to a drain common junction T between the MOS transistors Q101 and Q102.

In the comparator described above, comparison input data Vdata is applied to the gate electrode of the MOS transistor Q101 through a switch SW101, and a comparison reference level Vref is applied to the gate electrode of the MOS transistor Q103 through another switch SW102. The switches S1WO1 and SW102 are driven to be switched between on (closed) and off (open) in response to the same timing pulse signal φs. A comparison output Vout is extracted from the drain common junction S of the MOS transistors Q103 and Q104. FIG. 14 illustrates a relationship in timing of the timing pulse signal φs, comparison input data Vin and comparison output data Vout.

In the comparator described above, if there is a difference in characteristic between the N-channel MOS transistor Q101 and the N-channel MOS transistor Q103, then when the level difference between the two input signals, that is, the comparison input data Vdata and the comparison reference level Vref, is small, a comparation error occurs. Further, since normally an intermediate value between the "H" level and the "L" level of the comparison input data Vdata is set as the comparison reference level Vref, through current flows through the MOS transistors Q101 and Q103. Accordingly, where a comparator of the boosting type is used for a driving system of a liquid crystal display apparatus, a number of such comparators equal to the number of bits of display data are provided for each of pixels in each horizontal row. Consequently, power is consumed as much.

As an example, where 2-bit data is used, if the number of pixels in each horizontal row is 100, then 200 (100×2) comparators are required, and in a color system, since data for three colors of R (red), G (green) and B (blue) are required for each dot, totaling 600 comparators are required. In other words, as the number of bits of display data increases, also the number of comparators increases as much, and accordingly, the power consumption increases. It is to be noted that, if a single comparator substitutes them, since the single comparator drives a great capacity, the power consumption increases.

SUMMARY OF THE INVENTION

It is an object of the present invention to provide a comparator which can operate stably against an absolute value distribution of a threshold voltage among MOS transistors and has a wide allowable range against the threshold voltage dispersion and besides allows reduction in power consumption and a display apparatus which uses the comparator for a driving system.

In order to attain the object described above, according to an aspect of the present invention, there is provided a comparator, including a single MOS transistor, inputting means for inputting a comparison reference signal and a comparison input signal in a time series to a source electrode of the MOS transistor, current supplying means connected between a power supply and a drain electrode of the MOS transistor for supplying very small current to the drain electrode, voltage holding means connected between a gate electrode of the MOS transistor and a dc potential point, and switch means connected between the gate electrode and the drain electrode of the MOS transistor.

According to another aspect of the present invention, there is provided a display apparatus, comprising a driving system including the comparator described above.

According to a further aspect of the present invention, there is provided a driving method for a comparator which includes a single MOS transistor, current supplying means connected between a power supply and a drain electrode of the MOS transistor for supplying very small current to the drain electrode, voltage holding means connected between a gate electrode of the MOS transistor and a dc potential point, and switch means connected between the gate electrode and the drain electrode of the MOS transistor, the driving method including the steps of putting the switch means into an on state to short-circuit the gate electrode and the drain electrode of the MOS transistor to each other and simultaneously or thereafter applying a comparison reference signal to the source electrode of the MOS transistor, and putting the switch means into an off state so that a potential of the drain electrode of the MOS transistor is extracted as a comparison result and simultaneously or thereafter applying a comparison input signal to the source electrode of the MOS transistor.

In the comparator and the display apparatus, first within a preset period, a comparison reference signal is applied to the source electrode of the MOS transistor and the switch means is put into an on state. Consequently, a voltage with which a channel potential of the MOS transistor becomes substantially equal to the source potential (comparison reference signal) is held by the voltage holding means. Then, within a comparation period, a comparison input signal is applied to the source electrode of the MOS transistor and the switch means is put into an off state. Consequently, comparison of the source potential with the gate potential of the MOS transistor, that is, comparison of the comparison input signal with the held voltage (comparison reference signal) of the voltage holding means, is performed by the MOS transistor. Then, a result of the comparison appears at the drain electrode of the MOS transistor.

Thus, with the comparator and the display apparatus, since a single MOS transistor is used and a comparison input signal is compared in a time series with a comparison reference signal by the MOS transistor, a stable operation against a threshold voltage absolute value dispersion is possible, and reduction in power consumption is possible. Further, since comparison is performed not by means of two transistors, there is no influence of a relative dispersion (offset) of the threshold voltage and so forth in principle, and consequently, even if the signal level of the comparison input signal is low, a comparison operation can be executed without suffering from a comparation. Besides, since the circuit construction is simple, a high yield is obtained.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a circuit diagram showing a comparator according to a first preferred embodiment of the present invention;

FIG. 2 is a timing chart illustrating circuit operation of the comparator of FIG. 1;

FIGS. 3A to 3C are equivalent circuit diagrams illustrating different circuit operations of the comparator of FIG. 1;

FIGS. 4A to 4C are diagrams illustrating potential distributions of a MOS transistor of the comparator of FIG. 1 at different timings;

FIG. 5 is a characteristic diagram illustrating a channel potential with respect to a gate voltage of the MOS transistor of the comparator of FIG. 1;

DESCRIPTION OF THE PREFERRED EMBODIMENTS

Figure 6:
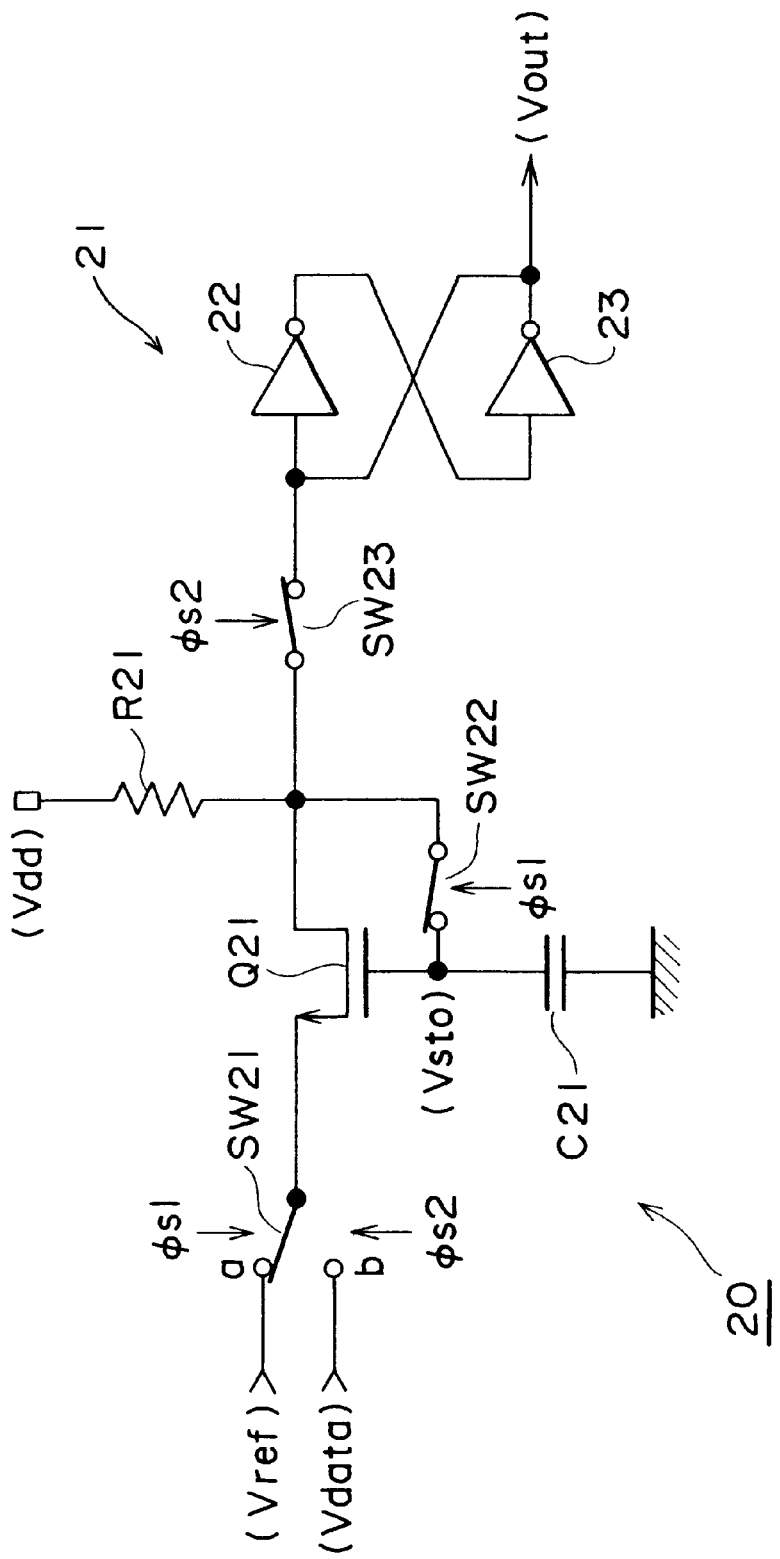
FIG. 6 is a circuit diagram showing a comparator according to a second preferred embodiment of the present invention.

FIG. 1 is a circuit diagram showing a circuit construction of a comparator of the boosting type according to a first preferred embodiment of the present invention.

Referring to FIG. 1, a comparator 10 of the boosting type according to the first embodiment includes an N-channel MOS transistor Q11 formed from, for example, a single TFT. An output terminal of a changeover switch SW11 having two inputs is connected to the source electrode of the MOS transistor Q11 on the input side. The changeover switch SW11 functions as inputting means for receiving a comparison reference level Vref and comparison input data Vdata in a time series.

In particular, the changeover switch SW11 receives the comparison reference level Vref at one input terminal "a" thereof and the comparison input data Vdata at the other input terminal "b" thereof, and first selects, when a changeover pulse signal φs1 is applied thereto, the comparison reference level Vref. Then, when another changeover pulse signal φs2 is applied in place of the changeover pulse signal φs1, the changeover switch SW11 selects the comparison input data Vdata. The comparison reference level Vref is set to an intermediate value between the "H" level and the "L" level of the comparison input data Vdata.

A resistance element R11 is connected between the drain electrode of the MOS transistor Q11, which is made of, for example, Al, and a power supply Vdd. The resistance element R11 functions as current supplying means for supplying current to (that is, causing current to flow into or out from) the drain electrode of the MOS transistor Q11, and has a resistance value set so that very small current may flow to the drain electrode. A comparison output Vout of the "H" level or the "L" level is extracted from the drain electrode of the MOS transistor Q11.

A capacitor C11 serving as voltage holding means is connected between the gate electrode of the MOS transistor Q11, which is made, for example, Mo, and a dc potential point such as, for example, the ground. A switch SW12 is connected between the gate electrode and the drain electrode of the MOS transistor Q11. The switch SW12 is put into an on or closed state to short-circuit the gate electrode and the drain electrode of the MOS transistor Q11 when the changeover pulse signal φs1 is applied thereto.

Subsequently, circuit operation of the comparator 10 of the boosting type having the construction described above is described with reference to equivalent circuit diagrams of FIGS. 3A to 3C and a timing chart of FIG. 2. Here, FIG. 3A shows an equivalent circuit to the comparator of FIG. 1 within a period t0 of the timing chart of FIG. 2; FIG. 3B shows an equivalent circuit within another period t1; and FIG. 3C shows an equivalent circuit within a further period t2. It is to be noted that potential distributions of the MOS transistor Q11 within the periods t1 and t2 (input Lo) and t2 (input Hi) of FIG. 2 are illustrated in FIGS. 4A to 4C.

First, within the period t0, none of changeover pulses φs1 and φs2 is generated. Consequently, the changeover switch SW11 does not select any one of the comparison reference level Vref and the comparison input data Vdata, and the switch SW12 is in an off (open) state. At this time, the MOS transistor Q11 is in an off state because the source electrode thereof is in a floating state. In this state, no current flows to the drain electrode of the MOS transistor Q11.

If, in the initial state, the level of the changeover pulse signal φs1 changes from the "L" level to the "H" level, then the presetting period t1 is entered. Within the presetting period t1, the changeover pulse signal φs1 is applied to the comparator 10. Consequently, the changeover switch SW11 selects the comparison reference level Vref and supplies it to the source electrode of the MOS transistor Q11, which is made of, for example, Mo. Consequently, the MOS transistor Q11 is put into an on state, and current flows from the power supply Vdd through the resistance element R11 to the drain electrode of the MOS transistor Q11 and further to the source electrode side.

At this time, the current is limited based on the resistance value of the resistance element R11 so that very small current may flow to the drain electrode of the MOS transistor Q11. Simultaneously, the changeover pulse signal φs1 is applied to the comparator 10. Consequently, since the switch SW12 is in an on state, the gate electrode of the MOS transistor Q11 is short-circuited to the drain electrode of the MOS transistor Q11 and has an equal potential to that of the drain electrode.

In a steady state of the MOS transistor Q11, the gate voltage Vg of the MOS transistor Q11 (=drain voltage Vd) is a voltage with which a channel potential φch becomes equal to the source voltage Vs as apparent from the following expressions:

$$\phi ch = Vg - Vth \approx Vs \quad (1)$$

$$\therefore Vg = Vd \approx Vs + Vth \quad (2)$$

where Vth is an effective threshold voltage including drain modulation, a back gate effect and so forth of the MOS transistor Q11.

The gate voltage Vg of the MOS transistor Q11 is held as a held voltage Vsto in the capacitor C11. In particular, the held voltage Vsto of the capacitor C11 is a voltage with which the channel potential of the MOS transistor Q11 becomes substantially equal to the source potential of the MOS transistor Q11. The presetting is completed thereby. FIG. 5 illustrates a characteristic of the channel potential φch with respect to the gate voltage Vg of the MOS transistor Q11.

Then, when the level of the changeover pulse signal φs1 changes from the "H" level to the "L" level and the level of the changeover pulse signal φs2 changes from the "L" level to the "H" level instead, the comparison period t2 is entered. Within the comparison period t2, the changeover switch SW11 selects the comparison input data Vdata in place of the comparison reference level Vref and supplies the comparison input data Vdata to the source electrode of the MOS transistor Q11. Further, the switch SW12 is put into an off state.

At this time, a held voltage Vsto with which an intermediate value between the "H" level and the "L" level of the comparison input data Vdata in the preset state becomes the channel potential φch is held as the gate voltage Vg of the MOS transistor Q11 by the capacitor C11. Therefore, if the comparison input data Vdata has the "H" level, since the level of the source potential of the MOS transistor Q11 changes to the "H" level, the MOS transistor Q11 is put into an off state and no current flows to the drain electrode. Accordingly, the drain potential of the MOS transistor Q11, that is, the comparison output Vout, has a level equal to the level of the power supply Vdd.

On the contrary, when the comparison input data Vdata has the "L" level, the MOS transistor Q11 is put into an on state because the level of the source potential thereof changes to the "L" level. Accordingly, the drain potential of the MOS transistor Q11, that is, the comparison output Vout, becomes equal to the input potential (the "L" level of the comparison input data Vdata). It is to be noted that the logic ("H" level/"L" level) of the comparison output Vout at a timing of a falling edge of the changeover pulse signal φs2 becomes a result of comparison.

As described above, in the comparator 10 according to the first embodiment, the single MOS transistor Q11 is used, and the resistance element R11 is connected between the drain electrode of the MOS transistor Q11 and the power supply Vdd and the capacitor C11 is connected between the gate electrode of the MOS transistor Q11 and the dc potential point while the switch SW12 is connected between the gate electrode and the drain electrode of the MOS transistor Q11. Further, the comparison reference level Vref and the comparison input data Vdata are inputted in a time series to the source electrode of the MOS transistor Q11 so that they may be compared with each other. Consequently, no through current flows through the MOS transistor Q11, and accordingly, current consumption is comparatively small and a stabilized operation against absolute value dispersion of the threshold voltage Vth of the MOS transistor Q11 is anticipated.

In particular, as can be recognized from the expression (2) given hereinabove, even if the threshold voltage Vth of the MOS transistor Q11 exhibits some dispersion, since the gate voltage Vg is preset without fail with the held voltage Vsto of the capacitor C11 for compensating for the dispersion, the comparator 10 is tough against the absolute value dispersion of the threshold voltage Vth of the MOS transistor Q11. Besides, since the comparator 10 is constructed such that comparison is performed not by two MOS transistors but by the single MOS transistor Q11, it is free in principle from an influence of a relative dispersion (offset) of the threshold voltage Vth or the like of the MOS transistor. Accordingly, even if the level difference of the comparison input data Vdata from the comparison reference level Vref is small, the comparator 10 can execute a comparation operation without suffering from a comparation error.

It is to be noted that, while the current to flow to the drain electrode of the MOS transistor Q11 can be adjusted with the resistance value of the resistance element R11, in order to raise the accuracy of the operation given by the expression (2), the current is minimized. However, since this increases the charging time when the comparison output Vout is in the "H" level, actually the current is determined by the trade-off among the level of the comparison input data Vdata, the error of the expression (2) and the speed.

Further, while, in the embodiment described above, switching of an input signal (between the comparison reference level Vref and the comparison input data Vdata) and switching of the switch SW12 are performed at the same timing, they need not necessarily be performed at the same timing, but they may have such a timing relationship that the switching of the switch SW12 is performed simultaneously with or prior to the switching of the input signal.

FIG. 6 shows a comparator of the boosting type according to a second preferred embodiment of the present invention.

Referring to FIG. 6, also the comparator 20 according to the second embodiment uses an N-channel MOS transistor Q21 formed from a single TFT similarly as in the comparator 10 of the first embodiment. An output terminal of a changeover switch SW21 having two inputs is connected to the source electrode of the MOS transistor Q21 on the input side. The changeover switch SW21 functions as inputting means for receiving a comparison reference level Vref and comparison input data Vdata in a time series.

In particular, the changeover switch SW21 receives the comparison reference level Vref at one input terminal "a" thereof and the comparison input data Vdata at the other input terminal "b" thereof. When a changeover pulse signal φs1 is applied to the changeover switch SW21, the changeover switch SW21 selects the comparison reference level Vref, but when another changeover pulse signal φs2 is applied in place of the changeover pulse signal φs1, the changeover switch SW21 selects the comparison input data Vdata. The comparison reference level Vref is set to an intermediate value between the "H" level and the "L" level of the comparison input data Vdata.

A resistance element R21 is connected between the drain electrode of the MOS transistor Q21 and a power supply Vdd. The resistance element R21 functions as current supplying means for supplying current to (that is, causing current to flow into or out from) the drain electrode of the MOS transistor Q21, and has a resistance value set so that very small current may flow to the drain electrode. A comparison result of the "H" level or the "L" level is extracted from the drain electrode of the MOS transistor Q21.

A capacitor C21 serving as voltage holding means is connected between the gate electrode of the MOS transistor Q21 and a dc potential point such as the ground. Further, a switch SW22 is connected between the gate electrode and the drain electrode of the MOS transistor Q21. The switch SW22 is put into an on state to short-circuit the gate electrode and the drain electrode of the MOS transistor Q21 when the changeover pulse signal φs1 is applied thereto.

An input terminal of a latch circuit 21 is connected to the gate electrode of the MOS transistor Q21 through a switch SW23. The switch SW23 is put into an on state when the changeover pulse signal φs2 is applied thereto and supplies a comparison result by the MOS transistor Q21 to the latch circuit 21. The latch circuit 21 is formed from two inverters 22 and 23 connected in parallel in the opposite directions to each other, that is, each connected such that the input terminal thereof is connected to the output terminal of the other inverter and the output terminal thereof is connected to the input terminal of the other inverter.

Figure 7:
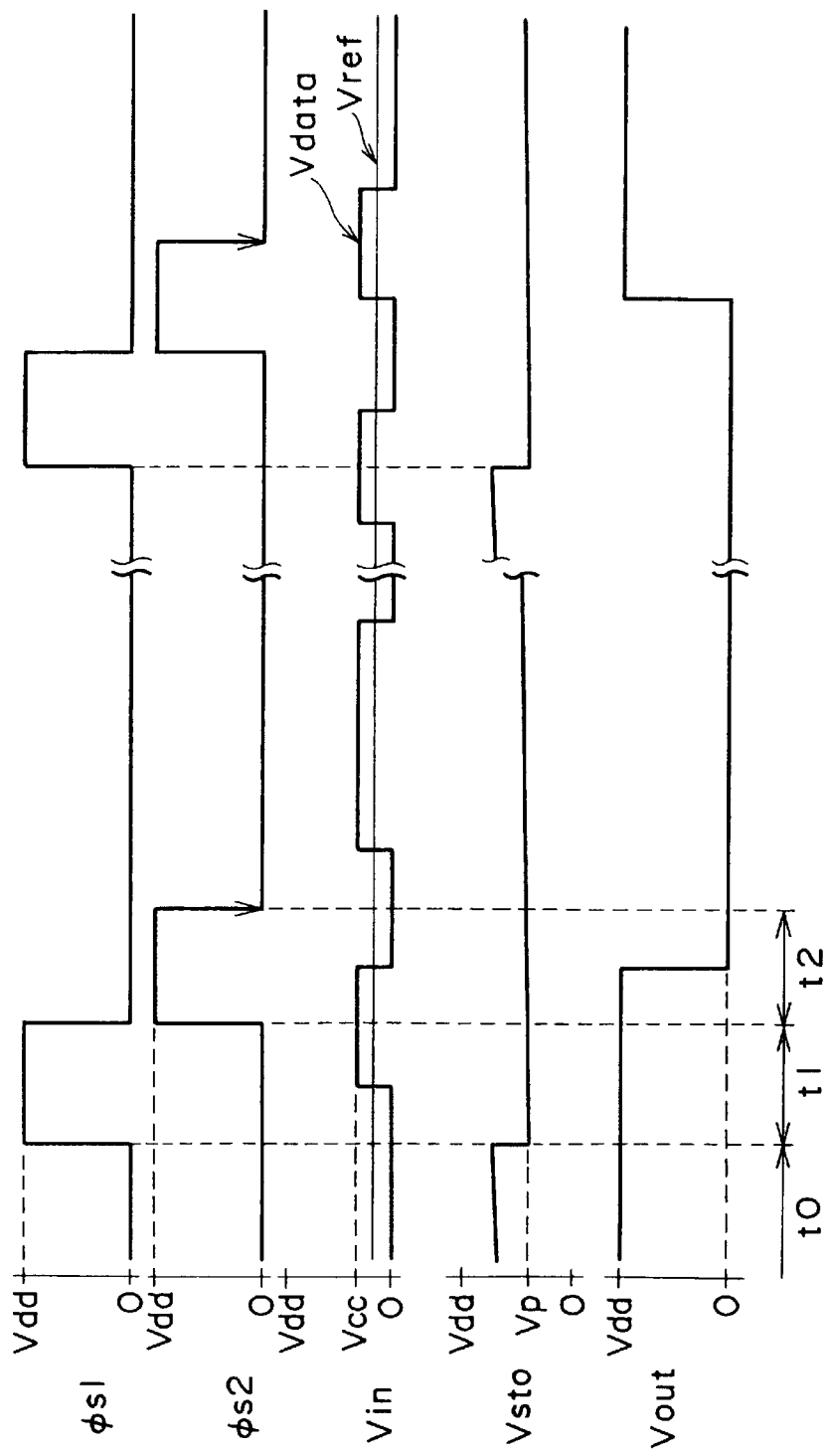
FIG. 7 is a timing chart illustrating circuit operation of the comparator of FIG. 6.

Subsequently, circuit operation of the comparator 20 having the construction described above is described with reference to a timing chart of FIG. 7.

First, within the period t0, none of the changeover pulses φs1 and φs2 is inputted to the latch circuit 21. Consequently, the changeover switch SW21 does not select any one of the comparison reference level Vref and the comparison input data Vdata, and the switch SW22 is in an off state. At this time, the MOS transistor Q21 is in an off state because the source electrode thereof is in a floating state. In this state, no current flows to the drain electrode of the MOS transistor Q21.

If, in the initial state, the level of the changeover pulse signal φs1 changes from the "L" level to the "H" level, then the presetting period t1 is entered. Within the presetting period t1, the changeover switch SW21 selects the comparison reference level Vref in response to the changeover pulse signal φs1, and supplies it to the source electrode of the MOS transistor Q21. Consequently, the MOS transistor Q21 is put into an on state, and current flows from the power supply Vdd through the resistance element R21 to the drain electrode of the MOS transistor Q21 and further to the source electrode side.

At this time, the current is limited by the resistance value of the resistance element R21 so that very small current may flow to the drain electrode of the MOS transistor Q21. Further, since the switch SW22 has been put into an on state in response to the changeover pulse signal φs1, the gate electrode of the MOS transistor Q21 is short-circuited to the drain electrode of the MOS transistor Q21 and has an equal potential to that of the drain electrode.

In a steady state of the MOS transistor Q21, the gate voltage Vg (=drain voltage Vd) of the MOS transistor Q11 is a voltage with which a channel potential φch becomes equal to the source voltage Vs as apparent from the expression (2) given hereinabove. The gate voltage Vg of the MOS transistor Q21 is held as a held voltage Vsto in the capacitor C21. The presetting is completed thereby.

Then, when the level of the changeover pulse signal φs1 changes from the "H" level to the "L" level and the level of the changeover pulse signal φs2 changes from the "L" level to the "H" level instead, the comparation period t2 is entered. Within the comparation period t2, the changeover switch SW21 selects the comparison input data Vdata in place of the comparison reference level Vref and supplies the comparison input data Vdata to the source electrode of the MOS transistor Q21. Further, the switch SW22 is put into an off state and the switch SW23 is put into an on state.

At this time, a held voltage Vsto with which an intermediate value between the "H" level and the "L" level of the comparison input data Vdata in the preset state becomes the channel potential φch is held as the gate voltage Vg of the MOS transistor Q21 by the capacitor C21. Therefore, if the comparison input data Vdata has the "H" level, since the level of the source potential of the MOS transistor Q21 changes to the "H" level, the MOS transistor Q21 is put into an off state and no current flows to the drain electrode. Accordingly, the drain potential of the MOS transistor Q21, that is, the comparison output Vout, has the level of the power supply Vdd.

On the contrary, when the comparison input data Vdata has the "L" level, the MOS transistor Q21 is put into an on state because the level of the source potential thereof changes to the "L" level. Accordingly, the drain potential of the MOS transistor Q21 becomes equal to the input potential (the "L" level of the comparison input data Vdata). It is to be noted that the logic ("H" level/"L" level) of the drain potential of the MOS transistor Q21 at a timing of a falling edge of the changeover pulse signal φs2 becomes a result of comparison.

The result of comparison is supplied through the switch SW23 which is put into an on state when a changeover pulse signal φs2 is applied thereto, and is held by the latch circuit 21. It is to be noted that the latch circuit 21 is connected to the drain electrode of the MOS transistor Q21 only within a comparation period in which the changeover pulse signal φs2 exhibits the "H" level.

As described above, in the comparator 20 according to the second embodiment, in addition to the operation and effects by the first embodiment which originate from the fact that the MOS transistor Q21 formed from, for example, a single TFT is used to perform time series comparison, since the latch circuit 21 is connected to the drain electrode of the MOS transistor Q21 through the switch SW23 such that a result of comparison which is the drain potential of the MOS transistor Q21 is latched by the latch circuit 21, a comparison output Vout free from a potential variation can be obtained.

In particular, where the construction of the comparator 10 of the first embodiment wherein the latch circuit 21 is not provided in the following stage is considered, except during a comparation period (period in which the changeover pulse signal φs1 or φs2 is in the "H" level), very small current flows to the drain electrode of the MOS transistor Q21 through the resistance element R21. Therefore, as can be seen apparently from the waveform of the comparison output Vout of the timing chart of FIG. 2, the output potential which is the drain potential of the MOS transistor Q21 becomes high. Naturally, although it is possible to additionally provide a switch to disconnect the MOS transistor Q21 from the power supply to eliminate the variation of the output potential, also in this instance, the possibility that the output potential may vary due to leak current of the MOS transistor or the like remains.

In contrast, where the latch circuit 21 is provided in the following state to latch a result of comparation, even if very small current flows, except a comparation period, to the drain electrode of the MOS transistor Q21 through the resistance element R21 and causes a potential variation at the drain potential of the MOS transistor Q21, this does not have an influence on the comparison output Vout of the comparison circuit 20. Accordingly, as can be seen apparently from the waveform of the comparison output Vout of the timing chart of FIG. 7, a result of comparison can be fixed to the "H" level/"L" level by the latch circuit 21.

Figure 8:
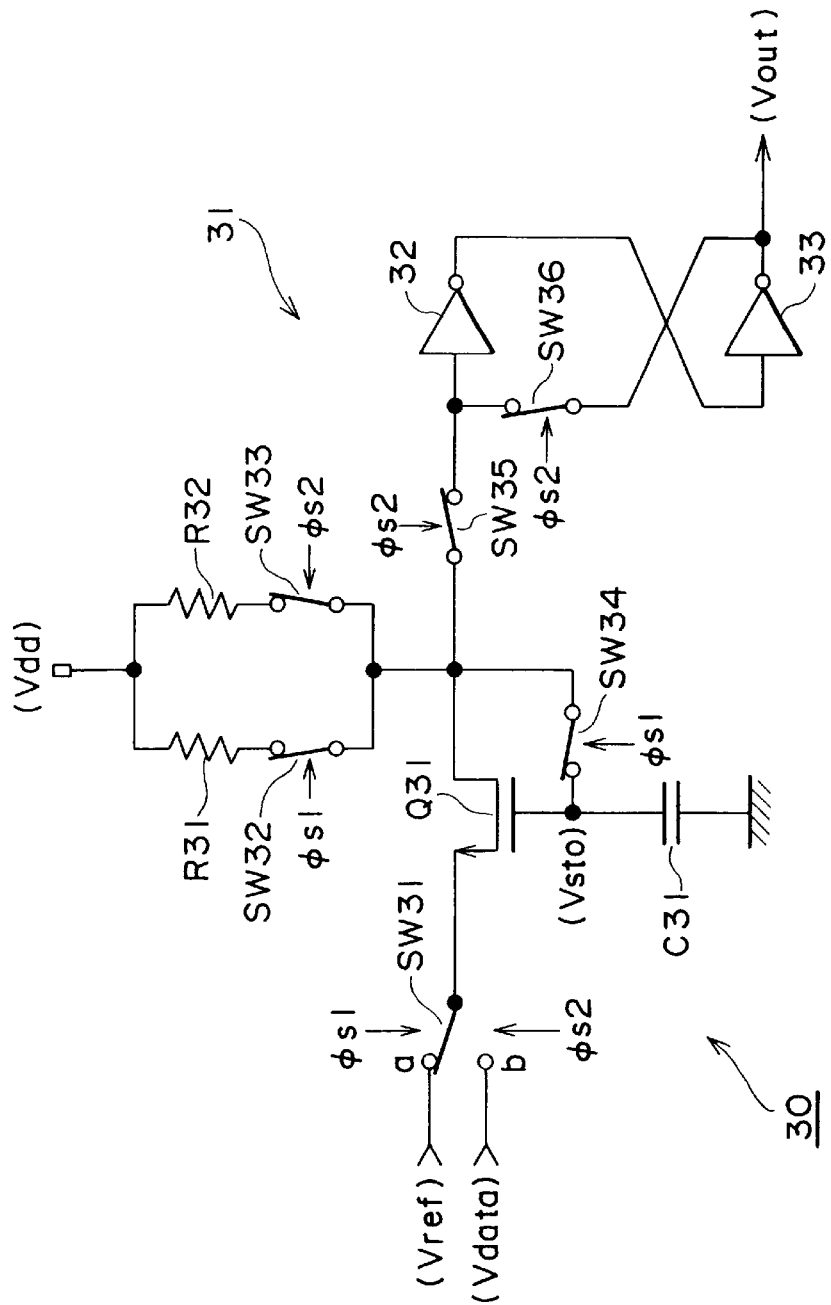
FIG. 8 is a circuit diagram showing a comparator according to a third preferred embodiment of the present invention.

FIG. 8 is a circuit diagram showing a comparator of the boosting type according to a third preferred embodiment of the present invention. Also the comparator according to the present embodiment is similar in a basic circuit construction to the comparator 20 according to the second embodiment that time series comparison is performed using a MOS transistor formed from, for example, a single TFT and a latch circuit formed from, for example, a TFT is provided in the following stage.

Referring to FIG. 8, an output terminal of a changeover switch SW31 having two inputs is connected to the source electrode of an N-channel MOS transistor Q31 on the input side. The changeover switch SW31 functions as inputting means for receiving a comparison reference level Vref and comparison input data Vdata in a time series.

In particular, the changeover switch SW31 receives the comparison reference level Vref at one input terminal "a" thereof and the comparison input data Vdata at the other input terminal "b" thereof. When a changeover pulse signal φs1 is applied to the changeover switch SW31 first, the changeover switch SW31 selects the comparison reference level Vref, but when another changeover pulse signal φs2 is applied in place of the changeover pulse signal φs1, the changeover switch SW31 selects the comparison input data Vdata. The comparison reference level Vref is set to an intermediate value between the "H" level and the "L" level of the comparison input data Vdata.

A switch SW32 and a resistance element R31 are connected in series between the drain electrode of the MOS transistor Q31 and a power supply Vdd. Similarly, a switch SW33 and a resistance element R32 are connected in series between the drain electrode of the MOS transistor Q31 and the power supply Vdd. In other words, the series connection circuit of the switch SW32 and the resistance element R31 and the series connection circuit of the switch SW33 and the resistance element R32 are connected in parallel to each other. For the resistance elements R31 and R32, resistance elements having resistance values substantially equal to each other are used.

The switch SW32 is put into an on state when a changeover pulse signal φs1 is applied thereto, and the switch SW33 is put into an on state when another changeover pulse signal φs2 is applied thereto. The resistance elements R31 and R32 function as current supplying means for supplying current to (that is, causing current to flow into or out from) the drain electrode of the MOS transistor Q31 when the switches SW32 and SW33 are in an on state, respectively, and have resistance values set so that very small current may flow to the drain electrodes. A comparison result of the "H" level or the "L" level is extracted from the drain electrode of the MOS transistor Q31.

A capacitance C31 serving as voltage holding means is connected between the gate electrode of the MOS transistor Q31 and a dc potential point such as, for example, the ground. Further, a switch SW34 is connected between the gate electrode and the drain electrode of the MOS transistor Q31. The switch SW34 is put into an on state to short-circuit the gate electrode and the drain electrode of the MOS transistor Q31 when the changeover pulse signal φs1 is applied thereto.

An input terminal of a latch circuit 31 is connected to the gate electrode of the MOS transistor Q31 through a switch SW35. The switch SW35 is put into an on state when the changeover pulse signal φs2 is applied thereto and supplies a comparison result by the MOS transistor Q31 to the latch circuit 31.

The latch circuit 31 is formed from two invertors 32 and 33 connected in parallel in the opposite directions to each other, that is, each connected such that the input terminal thereof is connected to the output terminal of the other inverter and the output terminal thereof is connected to the input terminal of the other inverter. A switch SW36 is connected in the current path of the latch circuit 31, for example, between the input terminal of the invertor 32 and the output terminal of the invertor 33. The switch SW36 is put into an off state to cut the current path of the latch circuit 31 when the changeover pulse signal φs2 disappears.

In the comparator 30 of the construction described above, an operation for performing time series comparison by means of the single MOS transistor Q31 is basically similar to that in the comparators 10 and 20 according to the first and second embodiments described hereinabove. When the changeover pulse signal φs1 or the changeover pulse signal φs2 is applied to the comparator 30, very small current is supplied to the drain electrode of the MOS transistor Q31 from the resistance element R31 or the resistance element R32.

In particular, very small current is not normally supplied through the resistance element R11 or R21 as in the case of the comparator 10 or 20 according to the first or second embodiment, but only when the changeover pulse signal φs1 or the changeover pulse signal φs2 is applied, very small current is supplied to the drain electrode of the MOS transistor Q31 through the resistance element R31 or resistance element R32. Where very small current is supplied to the drain electrode of the MOS transistor Q31 only within a period in which such very small current is required for a comparison operation in this manner, wasteful power consumption is eliminated, and consequently, reduction in power consumption can be achieved.

Further, since the latch circuit 31 includes the switch SW36 provided in the current path for selectively cutting the current path and the switch SW36 is controlled between on and off with the changeover pulse signal φs2, current flows to the latch circuit 31 only within a period in which it is necessary to latch a result of comparison (in the present embodiment, within a period in which the changeover pulse signal φs2 is in the "H" level), but no current flows within any other period in which no current is required. Consequently, further reduction in power consumption can be anticipated.

It is to be noted that, while the comparator 30 of the present embodiment is constructed such that the series connection circuit of the switch SW32 and the resistance element R31 and the series connection circuit of the switch SW33 and the resistance element R32 are connected in parallel and resistance elements having resistance values substantially equal to each other are used as the resistance elements R31 and R32 and besides the switches SW32 and SW33 are controlled between on and off with the changeover pulse signals φs1 and φs2 so that very small current is supplied to the drain electrode of the MOS transistor Q31 only within a period in which it is required for a comparation operation, the circuit construction is not limited to this.

Figure 9:
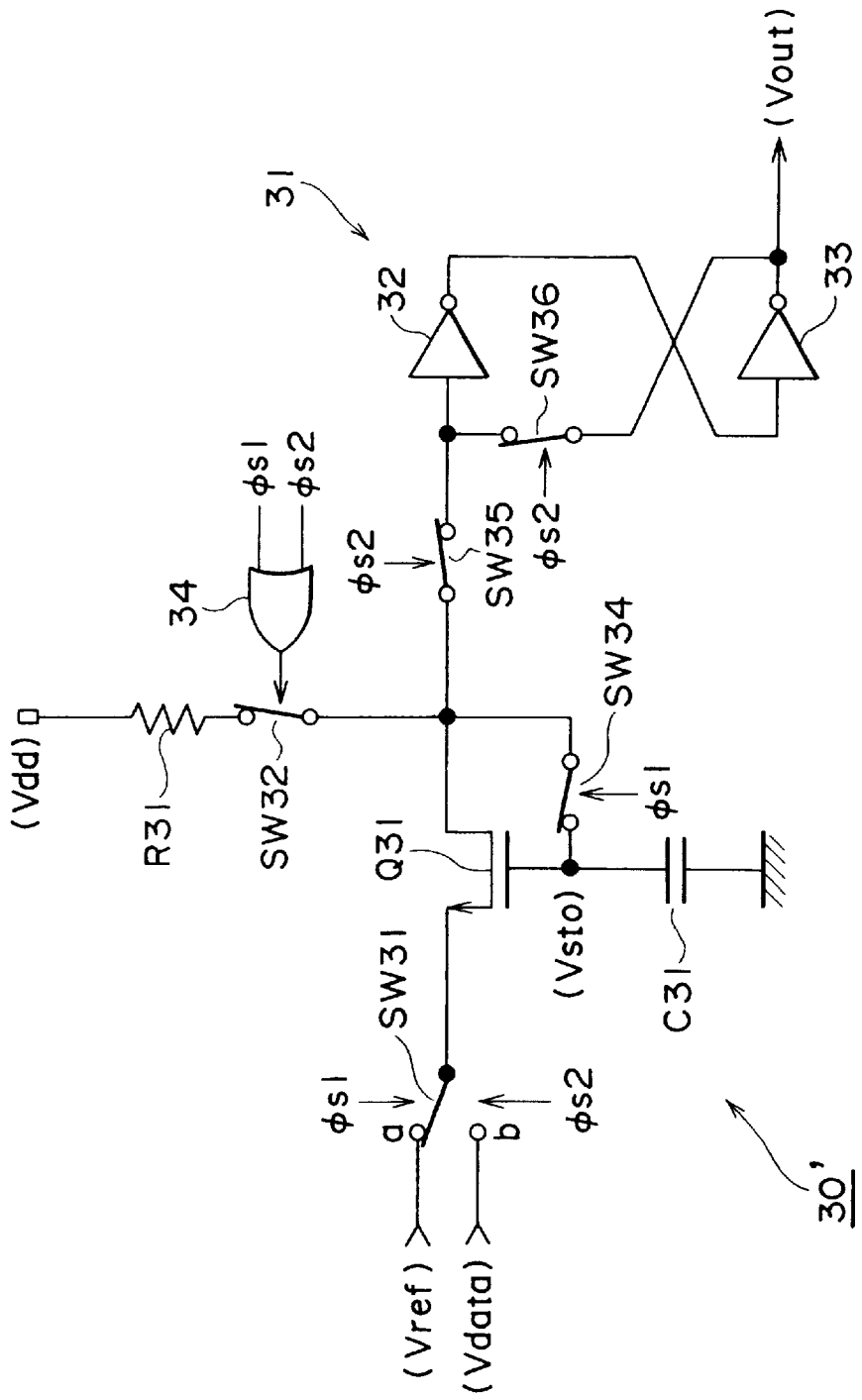
FIG. 9 is a circuit diagram showing a modification to the comparator of FIG. 8.

For example, also with such a circuit construction as shown in FIG. 9, it is possible to supply very small current to the drain electrode of the MOS transistor Q31 only within a period in which the current is required for a comparation operation. Referring to FIG. 9, the comparator 30' shown is a modification to but is different from the comparator 30 described hereinabove with reference to FIG. 8 in that it includes an OR gate 34 in place of the resistor R32 and the switch SW32. The OR gate 34 receives at two inputs thereof and logically ORs the changeover pulse signals φs1 and φs2. The resistance element R31 and the switch SW32 are connected in series between the power supply and the drain electrode of the MOS transistor Q31, and the switch SW32 is controlled between on and off with the logical OR output of the OR gate 34.

Figure 10:
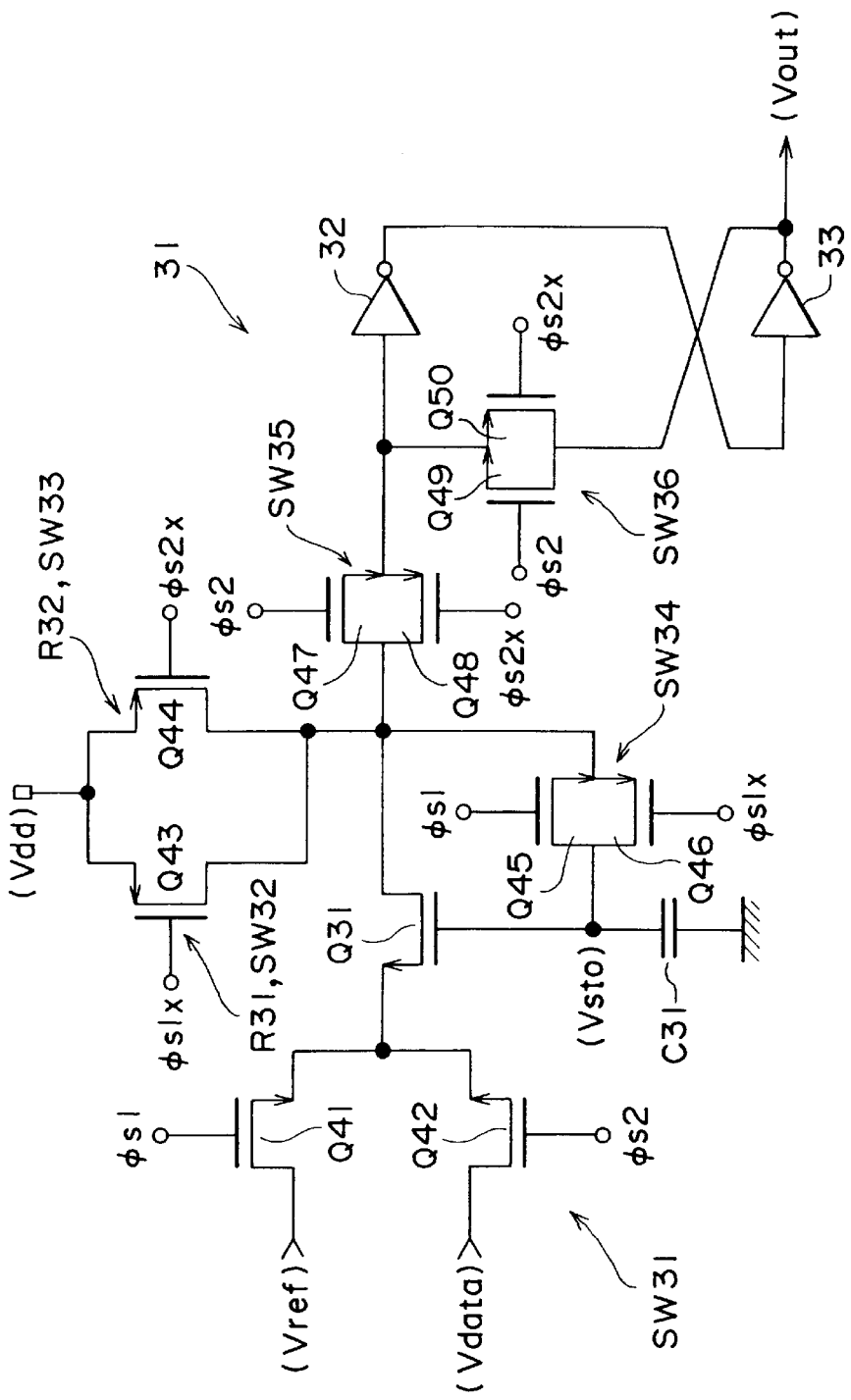
FIG. 10 is a circuit diagram showing an example of a detailed construction of the comparator of FIG. 8.

FIG. 10 is a circuit diagram showing an example of a detailed construction where the switches SW31 to SW36 and the resistors R31 and R32 of the comparator 30 (refer to FIG. 8) according to the third embodiment are formed from MOS transistors each formed from, for example, a TFT.

Referring to FIG. 10, the changeover switch SW31 is formed from two N-channel MOS transistors Q41 and Q42 connected to the drain electrode of the MOS transistor Q31.

The MOS transistor Q41 receives a comparison reference level Vref as a drain input thereto and receives a changeover pulse signal φs1 as a gate input thereto. Meanwhile, the MOS transistor Q42 receives comparison input data Vdata as a drain input thereto and receives a changeover pulse signal φs2 as a gate input thereto.

The switch SW32 and the resistance element R31 as well as the switch SW33 and the resistance element R32 are formed from N-channel MOS transistors Q43 and Q44 connected in parallel to each other, respectively. In particular, the MOS transistor Q43 has the functions of the switch SW32 and the resistance element R31, and the MOS transistor Q44 has the functions of the switch SW33 and the resistance element R32. The MOS transistors Q43 and Q44 receive inverted pulse signals φs1x and φs2x of the changeover pulse signals φs1 and φs2 as gate inputs thereto, respectively.

The switch SW34 has a transmission gate construction which uses an N-channel MOS transistor Q45 and a P-channel MOS transistor Q46 connected in parallel to each other, that is, C-MOS transistors. Similarly, the switch SW35 has a transmission gate construction which uses an N-channel MOS transistor Q47 and a P-channel MOS transistor Q48 connected in parallel to each other. The switch SW36 has a transmission gate construction which uses an N-channel MOS transistor Q49 and a P-channel MOS transistor Q50 connected in parallel to each other.

By forming the switches SW31 to SW36 and the resistance elements R31 and R32 from MOS transistors in this manner, although the number of transistors increases a little, the comparator can be produced simply by the same production process. Besides, it has been confirmed by the inventor that, even if the amplitude level of the comparison input data Vdata is approximately 0.5 V, there is no problem in regard to circuit operation.

The comparator of the boosting type according to the first, second or third embodiment of the present invention described above can be used, for example, in a liquid crystal display apparatus of the active matrix type wherein, on a transparent insulating circuit board on which polycrystalline silicon TFTS as switching elements for pixels are arranged in a two-dimensional matrix, a digital interface driving circuit is formed integrally with the pixel section from polycrystalline silicon TFTS. More particularly, the comparator can be used as a component of a circuit which forms a driving system of the liquid crystal display apparatus of the type mentioned, for example, as a component of a level shifter of a horizontal driving system. Naturally, the circuit mentioned may be formed from bulk-Si MOS transistors.

Figure 11:
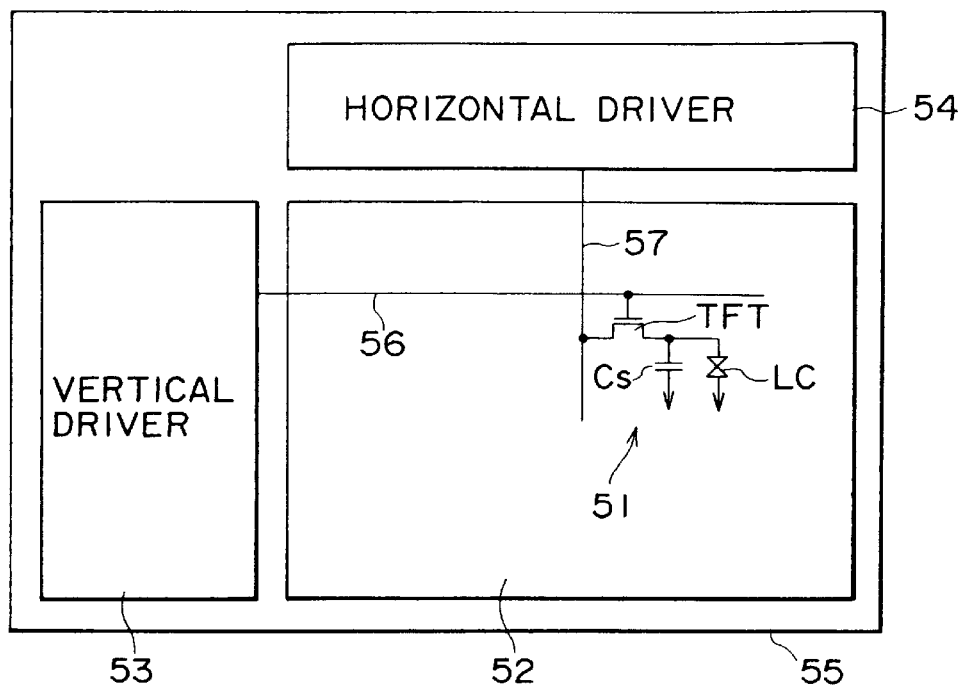
FIG. 11 is a schematic diagrammatic view showing an example of a liquid crystal display apparatus of the active matrix type.

FIG. 11 shows an example of such a liquid crystal display apparatus of the active matrix type as described above. Referring to FIG. 11, the liquid crystal display apparatus of the active matrix type shown includes a display area 52 on which pixels 51 are disposed in a matrix, that is, in rows and columns, a vertical driver 53 formed from, for example, a TFT for selecting the pixels 51 of the display area 52 in a unit of a row, and a horizontal driver 54 formed from, for example, a TFT for writing an image signal dot-sequentially or line-sequentially into the pixels 51 of a row selected by the vertical driver 53. The components mentioned are mounted on the same transparent insulating circuit board (liquid crystal panel) 55 formed from, for example, a glass plate.

In the display area 52, a number of gate lines 56, which may be made of, for example, Mo, equal to the number of rows and a number of signal lines 57, which may be made of, for example, Al, equal to the number of columns are arranged in a matrix, and a pixel 51 is arranged at each of individual intersecting points of them. The pixel 51 includes a pixel transistor TFT which is connected at the gate electrode thereof to a gate line 56 and at the source electrode (or drain electrode) thereof to a signal line 57, a liquid crystal cell LC having a pixel electrode made of, for example, ITO and connected to the drain electrode (or source electrode) of the pixel transistor TFT, and a holding capacitor Cs having an electrode connected to the drain electrode (or source electrode) of the pixel transistor TFT. The TFT may be a low temperature polycrystalline silicon TFT produced by re-crystallization by a laser or a high temperature polycrystalline silicon TFT produced by re-crystallization by solid phase growth.

Figure 12:
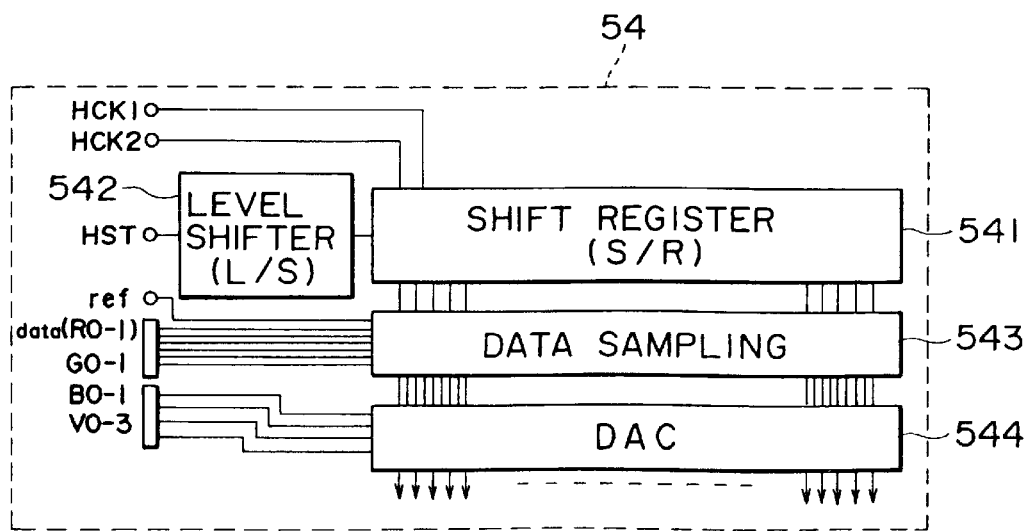
FIG. 12 is a block diagram showing a detailed construction of a horizontal driver of a liquid crystal display apparatus of the active matrix type.
Figure 13:
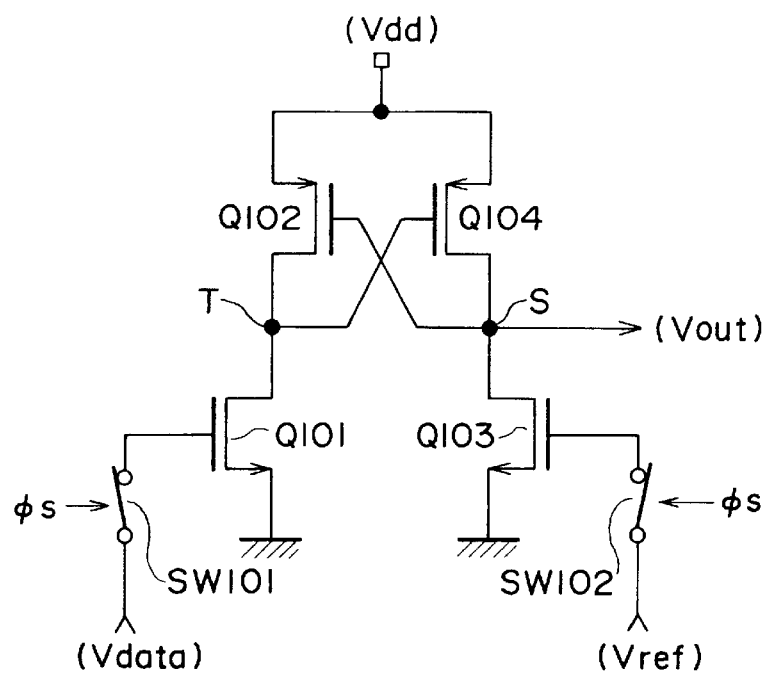
FIG. 13 is a circuit diagram showing a comparator as a related art.
Figure 14:
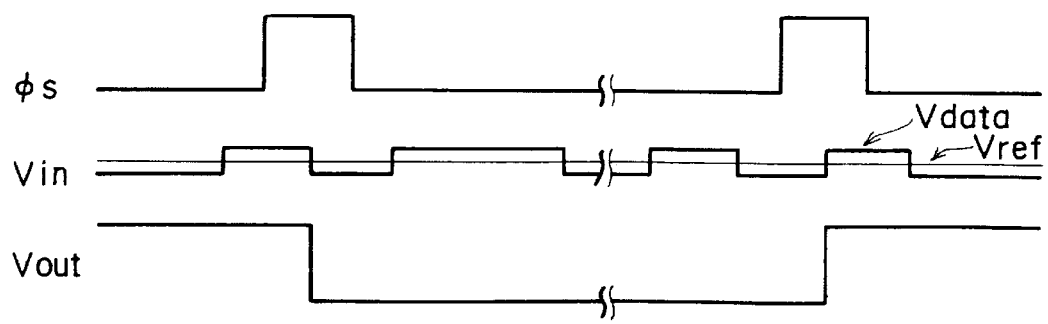
FIG. 14 is a timing chart illustrating circuit operation of the comparator of FIG. 13.

FIG. 12 shows an example of a detailed construction of the horizontal driver 54. Referring to FIG. 12, the horizontal driver 54 includes a shift register 541, a level shifter 542, a data sampling circuit 543, and a digital/analog converter (DAC) 544.

In the horizontal driver 54, when a horizontal start pulse signal HST is applied to the shift register 541 through the level shifter 542, the shift register 541 performs a shifting operation in synchronism with a horizontal clock signal HCK1 or HCK2 and successively generates sampling pulses from individual transfer stages thereof. The level shifter 542 shifts the level of the horizontal start pulse signal HST and supplies the horizontal start pulse signal HST of the shifted level to the shift register 541.

The data sampling circuit 543 samples display data data (R0 to R1, G0 to G1, B0 to B1) corresponding to the three primary colors of R, G and B with sampling clock pulses applied thereto from the shift register 541. The digital/analog converter 544 converts the display data data (R0 to R1, G0 to G1, B0 to B1) sampled by the data sampling circuit 543 into an analog signal and supplies the analog signal to each pixel 51 over a signal line 57.

In the liquid crystal display apparatus of the active matrix type of the construction described above, the comparator of the boosting type according to the first, second or third embodiment of the present invention described hereinabove is used as the level shifter 542 of the horizontal driver 54. Where the comparator which can perform a stable operation against a dispersion of the absolute value of the threshold voltage Vth and is not influenced by a relative dispersion (offset) of the threshold voltage Vth and so forth in principle and besides exhibits comparatively low power consumption in this manner is used as the level shifter 542 of the horizontal driver 54, the liquid crystal display apparatus can cope even with a horizontal start pulse signal HST of a low amplitude (low level) and besides exhibits low power consumption.

While, in the liquid crystal display apparatus described above, the comparator of the boosting type according to the first, second or third embodiment of the present invention is used for the level shifter 542 of the horizontal driver 54, the application of the comparator is not limited to this. For example, it is also possible to use the comparator of the boosting type as a comparator which is disposed at any circuit portion of any driving system at which a comparator is required such as, for example, at each signal line 57 (refer to FIG. 11) in the data sampling circuit 543.

The data sampling circuit 543 includes a comparator for comparing display data data (R0 to R1, G0 to G1, B0 to B1) with a certain comparison reference voltage, and a data latch for latching comparison output data of the comparator, the comparator and the data latch being provided for each of the signal lines 57. In the data sampling circuit 543 having the construction described above, the comparator of the boosting type according to the first, second or third embodiment of the present invention can be used as a comparator disposed for each of the signal lines 57.

Since a comparator is disposed for each of the signal lines 57 in the data sampling circuit 543 in this manner, a number of comparators equal to the number of horizontal pixels×the number of bits are disposed, and this number is very great. Accordingly, where the comparator of the boosting type according to the first, second or third embodiment of the present invention, that is, a comparator which is low in power consumption, is used for the comparators of the data sampling circuit 543, a comparation operation with augmented reliability can be performed by all of the comparators, and besides, the power consumption of the entire apparatus can be reduced significantly. Consequently, the comparator is useful particularly to a liquid crystal display apparatus of the portable type.

It is to be noted that, while, in the application example described above, the comparator of the boosting type according to the first, second or third embodiment of the present invention is used as part of a circuit which forms a driving system of a liquid crystal display apparatus as an example, it can be applied as a component of a circuit which forms a driving system of an EL display apparatus which uses an organic EL element as a display element for a pixel and further not only to a driving system of a display apparatus represented by a liquid crystal display apparatus or an EL display apparatus but also to any circuit system which employs a comparator.

While preferred embodiments of the present invention have been described using specific terms, such description is for illustrative purposes only, and it is to be understood that changes and variations may be made without departing from the spirit or scope of the following claims.

What is claimed is:

1. A comparator, comprising:
   a single MOS transistor;
   inputting means for inputting a comparison reference signal and a comparison input signal in a time series to a source electrode of said MOS transistor;
   current supplying means connected between a power supply and a drain electrode of said MOS transistor for supplying very small current to said drain electrode;
   voltage holding means connected between a gate electrode of said MOS transistor and a dc potential point; and
   switch means connected between said gate electrode and said drain electrode of said MOS transistor.

2. A comparator according to claim 1, wherein said inputting means includes switching means for selectively inputting the comparison reference signal and the comparison input signal.

3. A comparator according to claim 1, wherein said current supplying means includes a resistance element connected between said drain electrode of said MOS transistor and said power supply.

4. A comparator according to claim 1, wherein said current supplying means includes at least one MOS transistor connected between said drain electrode of said MOS transistor and said power supply.

5. A comparator according to claim 4, wherein said at least one MOS transistor is put into a conducting state only within a comparison period in which said MOS transistors performs comparison between the comparison reference signal and the comparison input signal and supplies, in the conducting state, very small current to said drain electrode of said MOS transistor.

6. A comparator according to claim 1, further comprising latch means for latching a comparison result of the comparison input signal with the comparison reference signal by said MOS transistor.

7. A comparator according to claim 6, wherein said latch means includes a latch circuit, and means connected between an input terminal of said latch circuit and said drain electrode of said MOS transistor for selectively connecting said latch circuit and said MOS transistor to each other.

8. A comparator according to claim 7, further comprising means for selectively cutting a current path of said latch circuit.

9. A comparator according to claim 1, wherein said MOS transistor is a thin film transistor.

10. A display apparatus, comprising:
   a driving system including a comparator;
   said comparator including a single MOS transistor,
   inputting means for inputting a comparison reference signal and a comparison input signal in a time series to a source electrode of said MOS transistor,
   current supplying means connected between a power supply and a drain electrode of said MOS transistor for supplying very small current to said drain electrode,
   voltage holding means connected between a gate electrode of said MOS transistor and a dc potential point, and
   switch means connected between said gate electrode and said drain electrode of said MOS transistor.

11. A display apparatus according to claim 10, wherein said inputting means includes switching means for selectively inputting the comparison reference signal and the comparison input signal.

12. A display apparatus according to claim 10, wherein said current supplying means includes a resistance element connected between said drain electrode of said MOS transistor and said power supply.

13. A display apparatus according to claim 10, wherein said current supplying means includes at least one MOS transistor connected between said drain electrode of said MOS transistor and said power supply.

14. A display apparatus according to claim 13, wherein said at least one MOS transistor is put into a conducting state only within a comparison period in which said MOS transistors performs comparison between the comparison reference signal and the comparison input signal and supplies, in the conducting state, very small current to said drain electrode of said MOS transistor.

15. A display apparatus according to claim 10, wherein said comparator further includes latch means for latching a comparison result of the comparison input signal with the comparison reference signal by said MOS transistor.

16. A display apparatus according to claim 15, wherein said latch means includes a latch circuit, and means connected between an input terminal of said latch circuit and said drain terminal of said MOS transistor for selectively connecting said latch circuit and said MOS transistor to each other.

17. A display apparatus according to claim 16, wherein said comparator further includes means for selectively cutting a current path of said latch circuit.

18. A display apparatus according to claim 10, further comprising a display element formed from a liquid crystal display element and forming a pixel.

19. A display apparatus according to claim 10, further comprising a display element formed from an electroluminescence element and forming a pixel.

20. A display apparatus according to claim 10, wherein said MOS transistor is a thin film transistor.

21. A driving method for a comparator which includes a single MOS transistor, current supplying means connected between a power supply and a drain electrode of said MOS transistor for supplying very small current to said drain electrode, voltage holding means connected between a gate electrode of said MOS transistor and a dc potential point, and switch means connected between said gate electrode and said drain electrode of said MOS transistor, said driving method comprising the steps of:
   putting said switch means into an on state to short-circuit said gate electrode and said drain electrode of said MOS transistor to each other and simultaneously or thereafter applying a comparison reference signal to said source electrode of said MOS transistor; and
   putting said switch means into an off state so that a potential of said drain electrode of said MOS transistor is extracted as a comparison result and simultaneously or thereafter applying a comparison input signal to said source electrode of said MOS transistor.

22. A driving method for a comparator according to claim 21, wherein said MOS transistor is a thin film transistor.

* * * * *